United States Patent [19]

Shen

[11] Patent Number: 5,795,829

[45] Date of Patent: Aug. 18, 1998

[54] METHOD OF HIGH DENSITY PLASMA METAL ETCHING

[75] Inventor: Lewis Shen, Cupertino, Calif.

[73] Assignee: Advanced Micro Devices, Inc., Sunnyvale, Calif.

[21] Appl. No.: 657,261

[22] Filed: Jun. 3, 1996

[51] Int. Cl.$^6$ .................................................. H01L 21/311
[52] U.S. Cl. ........................ 438/694; 438/718; 438/720; 427/535; 427/537; 427/576
[58] Field of Search .................. 156/643.1, 644.1, 156/646.1; 437/228, 189, 192; 427/535, 537, 576; 438/694, 697, 699, 718, 720

[56] References Cited

U.S. PATENT DOCUMENTS

| | | | |
|---|---|---|---|
| 4,775,550 | 10/1988 | Chu et al. | 427/38 |
| 5,017,513 | 5/1991 | Takeuchi | 437/228 |
| 5,064,683 | 11/1991 | Poon et al. | 427/39 |
| 5,106,786 | 4/1992 | Brady et al. | |
| 5,112,761 | 5/1992 | Matthews | |
| 5,173,439 | 12/1992 | Dash et al. | 437/67 |
| 5,182,235 | 1/1993 | Eguchi | |
| 5,194,119 | 3/1993 | Iwano et al. | 156/643 |
| 5,246,888 | 9/1993 | Miyamoto | 437/245 |
| 5,264,074 | 11/1993 | Muroyama et al. | 156/632 |
| 5,314,576 | 5/1994 | Kadomura | |
| 5,320,708 | 6/1994 | Kadomura et al. | 156/662 |
| 5,378,318 | 1/1995 | Weling et al. | 156/662 |
| 5,387,556 | 2/1995 | Xiaobing et al. | 437/228 |
| 5,397,433 | 3/1995 | Gabriel | 156/665 |
| 5,437,765 | 8/1995 | Loewenstein | 216/51 |
| 5,441,915 | 8/1995 | Lee | |
| 5,459,093 | 10/1995 | Kuroda et al. | |
| 5,512,331 | 4/1996 | Miyakuni | 427/528 |
| 5,545,289 | 8/1996 | Chen et al. | 156/643.1 |
| 5,582,679 | 12/1996 | Lianjun et al. | 156/651.1 |
| 5,604,381 | 2/1997 | Shen | 257/773 |

FOREIGN PATENT DOCUMENTS

| | | |
|---|---|---|
| 0 123 813 A3 | 11/1984 | European Pat. Off. |
| 0 573 212 A2 | 12/1993 | European Pat. Off. |
| 0622477A1 | 11/1994 | European Pat. Off. |
| 1052142 | 2/1989 | Japan |
| WO 94/12912 | 6/1994 | WIPO |

OTHER PUBLICATIONS

Sato, et. al., "The Effects of Mixing $N_2$ in $CCl_4$ on Aluminum Reactive Ion Etching", vol. 129(1982), Manchester, New Hampshire, pp. 2522–2527.

Wolf et al., "Silicon Processing for the VLSI Era," vol. 1 Process Technology, Lattice Press, pp. 565–567.

*Primary Examiner*—Robert Kunemund
*Assistant Examiner*—Luz Alejandro

[57] ABSTRACT

The high density plasma metal etch rate of a conductive material within a dense array of conductive lines is increased to no less than the etch rate of the conductive material in a bordering open field by injecting a sufficient amount of nitrogen into the total gas flow of the plasma. The injection of nitrogen in amounts of about 15% and 50% by volume of the total gas flow effectively reduces the etch rate differential between the dense array and open field, thereby reducing overetching, resist loss, and oxide loss in the open field, and facilitating planarization.

16 Claims, 5 Drawing Sheets

METHOD OF HIGH DENSITY PLASMA METAL ETCHING

TECHNICAL FIELD

The present invention relates to a method of manufacturing a semiconductor device wherein a dense array of conductive lines is etched at a rate no less than the rate at which the conductive lines are etched in a bordering open field. The invention has a particular application in manufacturing submicron circuitry using high density plasma etching.

BACKGROUND ART

The escalating requirements for high density and performance associated with ultra large scale integration require responsive changes in conductive patterns, which is considered one of the most demanding aspects of ultra large scale integration technology. High density demands for ultra large scale integration semiconductor wiring require increasingly denser arrays with minimal spacing between conductive lines. This objective becomes particularly difficult to achieve given the economic pressure for high speed production. Thus, the combined requirements of high speed and high density conductive wiring patterns pose a challenge which, to date, has not been satisfactorily achieved.

A traditional method for forming a dense array of conductive lines involves the use of a subtractive etch back step as the primary metal-patterning technique. This traditional technique basically comprises forming an insulating layer on a substrate, such as monocrystalline silicon, depositing a conductive layer, such as aluminum, an aluminum alloy, tungsten, polysilicon, tungsten silicide, or titanium silicide, forming a photo-resist mask on the conductive layer, wherein the photo-resist mask contains a pattern defining a dense array of conductive lines bordered by an open field wherein the distance between the conductive lines is considerably greater than the distance between conductive lines in the dense array, and etching through the mask. Typically, etching is conducted to optimize production speed as by utilizing an etching apparatus which generates a high density plasma, e.g., a high density chlorine plasma. Such a high density plasma etching technique comprises feeding chlorine gas, along with boron trichloride, into an etching apparatus, such as a Transformer Coupled Plasma (TCP) source type of apparatus to generate a high density plasma with Cl⁻ as the etching species. Model 9600, commercially available from Lam Research Corp., Fremont, Calif., has been found suitable. Other types of etching apparatus, such as other high density plasma source types of apparatus, can be used. For example, etching can also be conducted with an Electron Cyclotron Resonance (ECR) type apparatus, a Helicon Resonant Inductive coupled plasma source type apparatus or a Decoupled Plasma Source (DPS) type of apparatus.

Etching is normally conducted until the conductive material, typically a metal, is substantially removed between the conductive lines of the dense array along with any residues which may have formed. Overetching is conventionally performed to remove a portion of the underlying oxide to ensure complete removal of products between the conductive lines.

As employed throughout this application, the expression "open field" denotes an area wherein conductive lines are separated by a distance of at least 2 microns, while the expression "dense array" denotes a pattern of conductive lines which are separated by a distance of less than 1.0 micron.

A problem typically encountered when etching a conductive layer, such as a metal layer, to form a dense array of lines bordered by an open field using a high plasma density etch technique, such as a TCP apparatus, is that the etch rate of the metal layer within the dense array is inevitably less than the etching rate of the metal layer in the bordering open field. This etch rate differential is commonly referred to as the "etch rate microloading." The etch rate differential between the high density plasma metal etch rate within the dense array vis-à-vis the bordering open field or etch rate microloading generates numerous problems, which are exacerbated as integration increases and smaller interwiring spacings are required within dense arrays. For example, the etch rate microloading phenomenon causes problems such as undercutting of the conductive lines within the dense array, since it is virtually impossible to determine the etch end point within the dense array with any reasonable degree of accuracy. Additional problems stemming from etch rate microloading include the formation of sloping profiles on leading and tailing conductive lines as well as on isolated conductive lines, and increased time and work for planarizing a subsequently applied dielectric layer.

In copending application Ser. No. 08/368,170 filed on Jan. 3, 1995 (Our Docket No. 1033-081), a method is disclosed for reducing undercutting of conductive lines within a dense array by changing one or more of the initial etching conditions at a strategic point in the etching process.

Copending application Ser. No. 08/423,495 filed on Apr. 19, 1995 (Our Docket No. 1033-098), discloses a method of preventing undercutting of conductive lines in a dense array by providing one or more non-functional dummy or conductive lines in the bordering open field.

In copending application Ser. No. 08/423,497 filed on Apr. 19, 1995 (Our Docket No. 0133-099), techniques are disclosed for avoiding undercutting, formation of sloping conductive lines and reducing the amount of dielectric material required for planarization, by employing one or more non-functional conductive components in the dielectric layer under the conductive lines of the dense array.

The increasing demands for minimal interwiring spacings associated with ultra-large scale integration exacerbate the impact of the etch rate microloading phenomenon on the manufacturing of semiconductor devices. For example, upon detection of the etch end point of a metal layer in an open field bordering a dense array, a substantial amount of metal remains between conductive lines within the dense array. It was found that the etch rate differential becomes even more pronounced as the distance between the conductive lines of the dense array decreases. Thus, as integration increases, a much longer overetch time is required to ensure that metal lines within the dense array are formed free of bridging. Longer overetch time necessarily involves longer processing time and, hence, reduced throughput. Moreover, a longer overetch time increases the amount of resist lost and requires a deeper oxide cut in the open field. These adverse consequences of the etch rate microloading phenomenon render it extremely difficult to continue employing conventional methodology for submicron geometry etching of conductive lines within a dense array.

Nitrogen has been added to etch chemistry to improve etch selectivity with respect to resist and to provide a slightly sloped metal profile. However, the amount of nitrogen incorporated in the etch chemistry has been limited to less than 10% by volume of the total gas flow, employed only during the early etch sequence and cut off, in order to minimize nitrogen induced residues.

In copending application Ser. No. 08/359,232 filed on Dec. 19, 1994, a method is disclosed for etching a composite comprising a photoresist on an anti-reflection coating, employing an inert gaseous nitrogen plasma to maintain the resist profiles during removal of a spin-on anti-reflective layer. Thus, nitrogen is employed to increase the selectivity of the anti-reflection layer vis-à-vis the photoresist.

In copending application Ser. No. 08/554,413 filed on Nov. 8, 1995, a method is disclosed wherein an inert gaseous plasma, preferably of nitrogen, is employed to etch an anti-reflective coating without any substantial etching of exposed underlying polysilicon. As indicated above, nitrogen is known to induce a residual effect, i.e., result in the generation of an etching residue which is problematic.

There exists a need to provide semiconductor methodology, wherein the etch rate microloading is reduced to zero and even reversed by an efficient, cost-effective and simplified technique to satisfy the demands of ultra-large scale integration for increasingly denser arrays with minimal interwiring spacing between conductive lines.

DISCLOSURE OF THE INVENTION

An object of the present invention is a method of manufacturing a semiconductor device having a dense array of conductive lines employing a high density plasma etching technique wherein the etch rate within the dense array is increased to no less than the etch rate in the bordering open field.

Additional objects, advantages and other features of the invention will be set forth in part in the description which follows and in part will become apparent to those having ordinary skill in the art upon examination of the following or may be learned from practice of the invention. The objects and advantages of the invention may be realized and obtained as particularly pointed out in the appended claims.

According to the present invention, the foregoing and other objects are achieved in part by a method of manufacturing a semiconductor device, which method comprises: forming an insulating layer; forming a layer of conductive material on the insulating layer; forming a mask on the conductive layer, which mask contains a pattern defining a dense array of conductive lines bordered by an open field; and etching the conductive layer through the mask with a high density plasma generated by a gas flow containing nitrogen in an amount sufficient to increase the etch rate of the conductive material within the dense array to no less than the etch rate of the conductive material in the open field.

Additional objects and advantages of the present invention will become readily apparent to those skilled in this art from the following detailed description, wherein only the preferred embodiment of the invention is shown and described, simply by way of illustration of the best mode contemplated for carrying out the invention. As will be realized, the invention is capable of other and different embodiments, and its several details are capable of modifications in various obvious respects, all without departing from the invention. Accordingly, the drawings and description are to be regarded as illustrative in nature, and not as restrictive.

DESCRIPTION OF THE INVENTION

The present invention addresses and solves problems stemming from the high density plasma metal etch rate differential between a conductive layer, e.g., a metal layer, within a dense array vis-à-vis a bordering open field, i.e., the etch rate microloading phenomenon. Such problems stemming from the etch rate microloading phenomenon include bridging between conductive lines, resist lost, deep oxide cuts in the open field and time consuming planarization, and are exacerbated as the distance between conductive lines of a dense array is decreased to satisfy the demands for ultra-large scale integration.

Figure 1A:
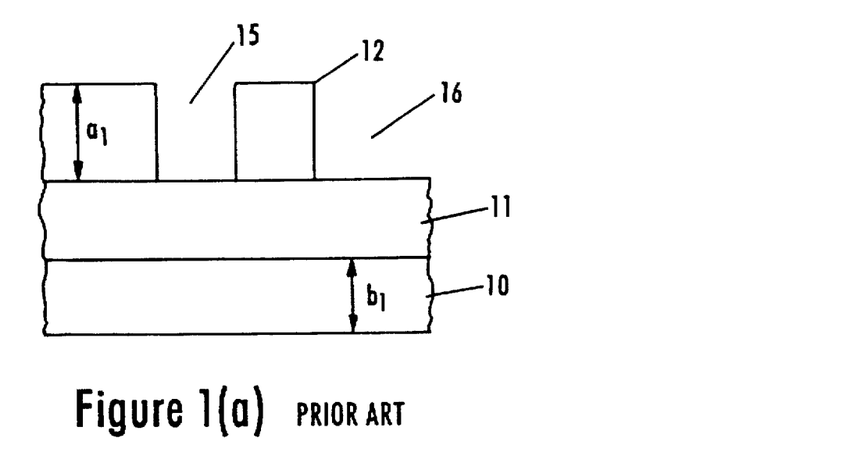
FIGS. 1(a)–1(d) schematically illustrate a conventional etching process for forming a dense array.

A typical conventional high density plasma etching technique employing conventional etching chemistry, such as chemistry predicated upon chlorine gas and boron trichloride, conducted in a TCP type of apparatus, comprises the generation of $Cl^{31}$ as in the etching species. As shown in FIG. 1(a), an oxide layer 10, such as silicon dioxide, is formed on a semiconductor substrate (not shown). A conductive layer 11, such as a metal, e.g., aluminum or an aluminum alloy, is formed on oxide layer 10. A photoresist layer is then formed on metal layer 11 and developed in a conventional manner to form photoresist mask 12 containing a pattern 15 defining a dense array of conductive lines bordered by an open field 16. The thickness of the photoresist mask is designated by "$a_1$."

Figure 1B:
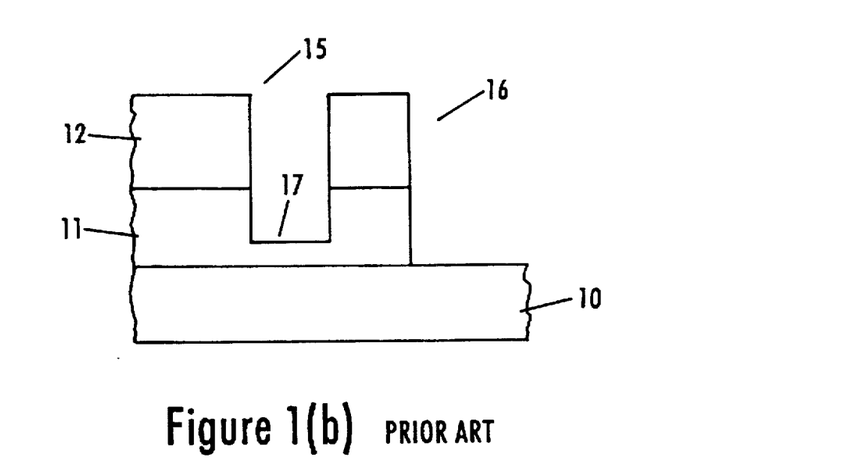
Figure 1C:
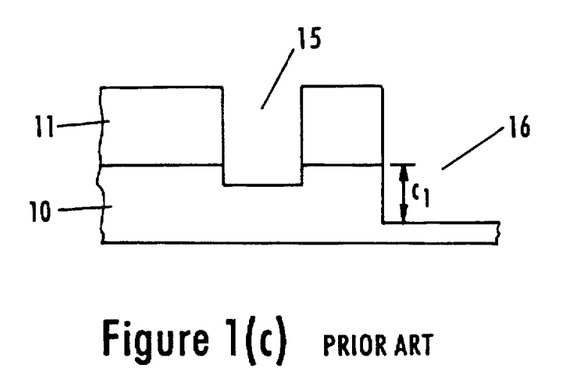

High density plasma etching is then conducted until the etch end point is detected in the open field, as schematically illustrated in FIG. 1(b). However, at the time such etch point is detected in the open field, metal 17 remains bridging conductive lines within the dense array. Overetching is then conducted, as shown in FIG. 1(c), to remove metal 17 bridging conductive lines in the dense array and any residue, such as silicon and copper which are usually present in typical aluminum alloys employed for forming conductive lines in the semiconductor industry, or titanium or titanium nitride in the event a conventional barrier layer is employed. Etching is further continued until a portion of the underlying oxide layer 10 is removed as shown in FIG. 1(c), leaving oxide layer 10 with a thickness "$c_1$" under the metal lines in the open field.

Figure 1D:
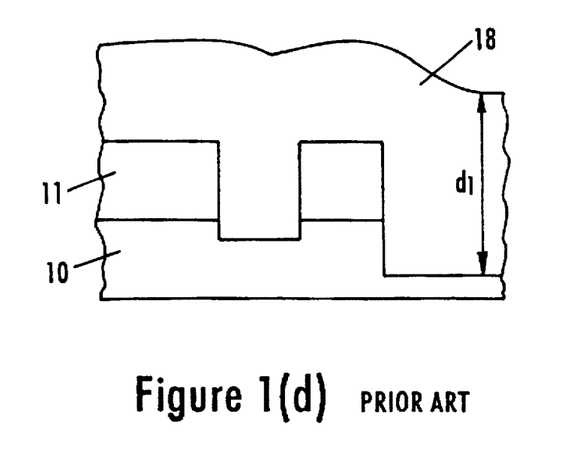

Subsequently, a dielectric layer 18 is applied to a depth "$d_1$" in the open field as illustrated in FIG. 1(d), and planarized, as by etching or chemical-mechanical polishing (CMP). As apparent from FIGS. 1(b)–1(d), due to the etch rate microloading phenomenon, upon detection of the etch end point in the open field, metal 17 remains between conductive lines of the dense array. Upon overetching, a considerable amount of oxide is removed in the open field and, hence, a considerable amount of additional dielectric material is subsequently required for planarization.

In accordance with the present invention, the problems attendant upon conventional high density plasma etching techniques to form a pattern of conductive lines within a dense array, notably the problems stemming from the etch rate microloading phenomenon, are solved by an efficient cost-effective technique, whereby the etch rate microloading phenomenon is brought to zero or, in fact, reversed. Thus, in accordance with the present invention, the high density plasma etch rate of conductive material within a dense array is elevated to at least the etch rate of the conductive material in a bordering open field to achieve zero etch rate microloading. In accordance with the present invention, the etch rate of the conductive material within the dense array is also elevated to exceed the etch rate of the conductive material in a bordering open field, thereby reversing the etch rate microloading phenomenon.

In accordance with the present invention, zero or reversed etch rate microloading is achieved by the elegantly simplified, cost-effective technique of introducing a sufficient amount of nitrogen into the etching chemistry to elevate the high density plasma etch rate of a conductive material, such as a metal, within a dense array to at least the etch rate of the metal in a bordering open field.

In conducting the present invention, conventional high density plasma etching chemistry conditions and equipment, can be employed. Thus, the invention can be practiced using a conventional high density plasma etching technique modified by introducing a sufficient amount of nitrogen into the gas flow to elevate the etch rate of the metal within the dense array to achieve zero or reversed etch rate microloading. Given the stated objective, one having ordinary skill in the art can easily optimize the amount of nitrogen introduced and process parameters for a particular situation, e.g., for a particular metal, geometry and etching chemistry. It has been found that introducing nitrogen in an amount greater than about 15% by volume of the total gas flow, such as between about 20% to about 50% by volume of the total gas flow, preferably about 25% to about 40% by volume of the total gas flow, the objective of the present invention can be achieved in that zero or reversed etch rate microloading is attained. Thus, the present invention stems from the discovery that the etch rate of a conductive material, such as a metal, within a dense array is elevated vis-à-vis a bordering open field by introducing a sufficient amount of nitrogen into the gas flow of the etching chemistry to generate a high density plasma.

Although nitrogen has previously been employed in etching chemistry to modify etch selectivity and to alter the profile of a metal line, the amount of nitrogen introduced has been limited to avoid formation of nitrogen induced residues which adversely affect processing and can lead to degradation in the performance of the resulting semiconductor device. However, it was unexpectedly found that nitrogen can be introduced in amounts in excess of 15% by volume, even up to 50% by volume, of the gas flow rate without any adverse impact on processing or the performance of the resulting semiconductor device.

It was found that if the conductive layer is formed of an aluminum-copper alloy having a copper content of less than about 0.5%, the impact of nitrogen on residue formation is virtually insignificant. After extensive experimentation and investigation, it was found that if the conductive layer is formed of an aluminum-copper alloy having a copper content greater than about 0.5%, nitrogen-induced residue may not actually prove detrimental as many such residues are not electrically conductive. Moreover, some residues can be converted into oxides and, hence, rendered non-conductive. Furthermore, after additional extensive experimentation and investigation, it was found that high concentrations of nitrogen can be employed during high density plasma etching of aluminum-copper alloys having a significantly high concentration of copper, e.g., above 0.5%, if the alloy is deposited at a temperature either below about 150° C. or above about 350° C.

Thus, in accordance with the present invention, a sufficient amount of nitrogen is added to the etch chemistry to achieve zero or reversed etch rate microloading, wherein the etch rate within the dense array is even faster than the bulk etch rate. As a result, various benefits are achieved. For example, overetching to avoid bridging is eliminated. In addition, the amount of oxide lost in the open field due to overetching is reduced with an attendant advantageous reduction in the amount of dielectric material required for subsequent planarization.

EXAMPLE

A conventional high density plasma etching technique was conducted employing a conventional etch recipe and conventional process parameters to etch a submicron metal feature using a high plasma density etch tool, such as a TCP 9600 produced by LAM. In accordance with the present invention, such conventional parameters, which are set forth below, are modified insofar as nitrogen is introduced in an amount equal to or greater than 20% by volume of the total gas flow, as indicated below.

Pressure: 5–20 mT (typically 15 mT)

Top Power: 250–600 Watt (typically 450 Watt)

Bottom Power: 100–300 Watt (typically 150 Watt)

Cl2: 30–70 sccm (typically 40 sccm)

BCl3: 10–50 sccm (typically 20 sccm)

N2: 15–50 sccm (typically 15 sccm) (=or >20% of the total gas flow)

Figure 2A:
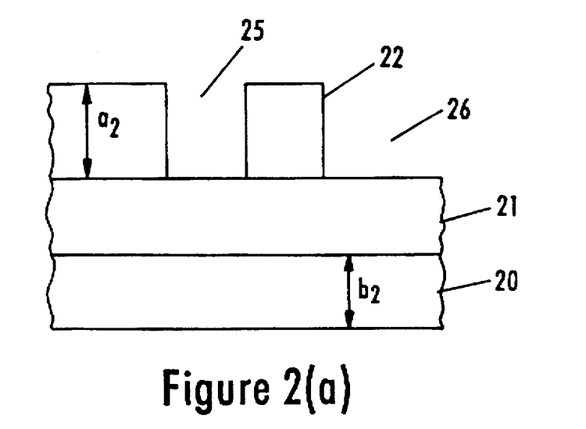
FIGS. 2(a)–2(d) schematically illustrate an embodiment of the present invention.
Figure 2B:
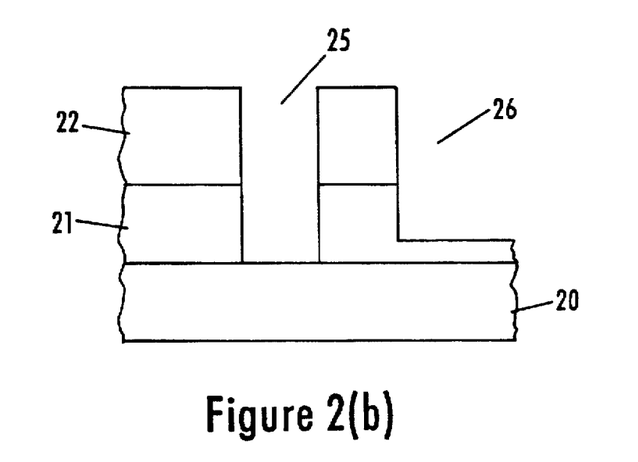

Other: CF4, CHF3, HBr, HCl (optional) As shown in FIG. 2(a), an aluminum layer 21 is deposited by conventional techniques on oxide layer 20 formed on a semiconductor substrate (not shown). A resist mask 22, having a thickness "$a_2$," is then formed containing a pattern 22 defining a dense array 25 and a bordering open field 26. Employing the parameters set forth above, including the introduction of nitrogen in an amount of at least 20% by volume of the gas flow rate, reversed etch rate microloading is achieved whereby, unlike in the conventional methodology depicted in FIG. 1(b), the etch rate of the metal layer within the dense array 25 exceeds the etch rate of the same metal layer in the bordering open field 26.

Figure 2C:
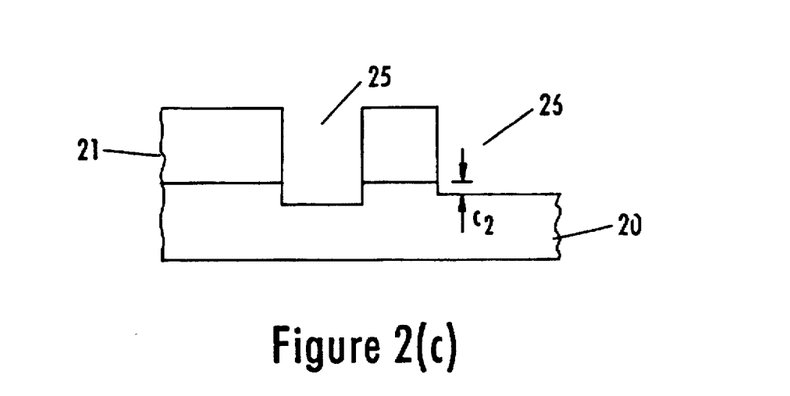
Figure 2D:
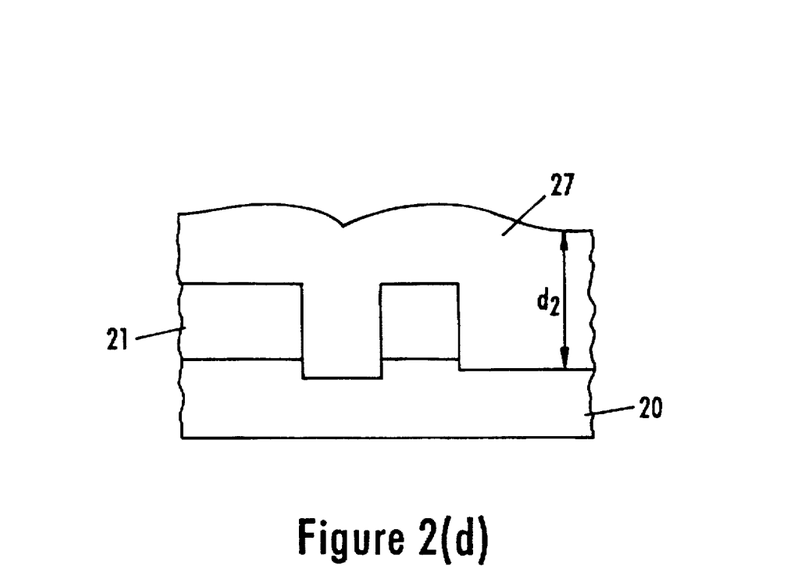

As shown in FIG. 2(c), in accordance with the present invention, etching is continued until the metal layer is removed from open field 26, resulting in a slight overetching of oxide layer 20 within the dense array 25. The thickness of oxide layer 20 under the metal lines of the open field is designated as "$c_2$." As shown in FIG. 2(d), the dielectric layer 27 is then applied to a height of "$d_2$" in the open field and planarized.

The advantages of the present invention are apparent from a comparison of FIGS. 2(a)–2(d) vis-à-vis FIGS. 1(a)–1(d). For example, in accordance with the present invention, the etch rate microloading phenomenon is brought to zero or reversed by an inexpensive simplified technique yielding several advantages. As a result of elevating the high density plasma etch rate of the metal layer in the dense array vis-à-vis the bordering open field, the amount of and time required for overetching is considerably reduced, thereby increasing production throughput with an attendant economic benefit. In addition, the present invention reduces the amount of resist lost, thereby enabling reduction in the amount of resist. Thus, the photoresist mask 22, as shown in FIG. 2(a), can be formed at a thickness $a_2$ which is considerably less than the thickness $a_1$ of photomask 12 shown in FIG. 1(a) in accordance with conventional practices.

In addition, the method of the present invention results in less field oxide removal. Accordingly, a significant advantage of the present invention resides in reducing the amount of the applied interlayer oxide. With reference to FIG. 2(a) of the present invention, the oxide layer 20 is deposited at a thickness $b_2$, which is considerably less than the thickness $b_1$ of oxide layer 10 shown in FIG. 1(a) in accordance with the conventional methodology. In addition, the present invention advantageously enables a significant reduction in the amount of dielectric material employed in subsequent processing prior to planarization. Since less oxide is removed from the open field, the planarization dielectric may be applied at a thickness $d_2$, shown in FIG. 2(d), which is considerably less than the thickness $d_1$, shown in FIG. 1(d), of conventional methodology. Since less planarization dielectric is required, planarization can be effected more rapidly, thereby further increasing cycle time and production throughput. The present invention also enables an improvement in sidewall protection in that more reliable conductive lines are formed. In view of the resulting sloped profile (not illustrated), the gaps between the conductive lines can be easily filled and, hence, an improvement in production control is also realized.

The present invention has been exemplified without the use of a barrier layer and/or anti-reflective coating. However, in accordance with the present invention, conventional barrier layers and/or anti-reflective coatings can be employed.

In an embodiment of the present invention, a conductive barrier layer is initially deposited on an underlying insulating layer, and the conductive line material, preferably a metal such as aluminum or an aluminum alloy, is deposited on the barrier layer. The barrier layer can be deposited by any conventional technique, such as chemical vapor deposition or physical vapor deposition, and can comprise any material conventionally employed for that purpose, such as titanium.

In another embodiment of the present invention, an anti-reflective coating is formed on the conductive metal layer. The anti-reflective coating can be deposited by any conventional technique, such as chemical vapor deposition or physical vapor deposition, and can be any material conventionally employed for that purpose, such as titanium nitride.

Typically, the anti-reflective coating has a thickness up to about 1100Å; the barrier layer a thickness of about 250 to about 1000Å, and the second metal layer, such as aluminum or an aluminum alloy, a thickness of about 4000 to about 15000Å.

It is also within the scope of the present invention to employ a composite barrier film of titanium and titanium nitride. In such an embodiment, the titanium barrier layer can have a thickness of about 250Å and the titanium nitride layer a thickness of about 600Å.

Figure 3:
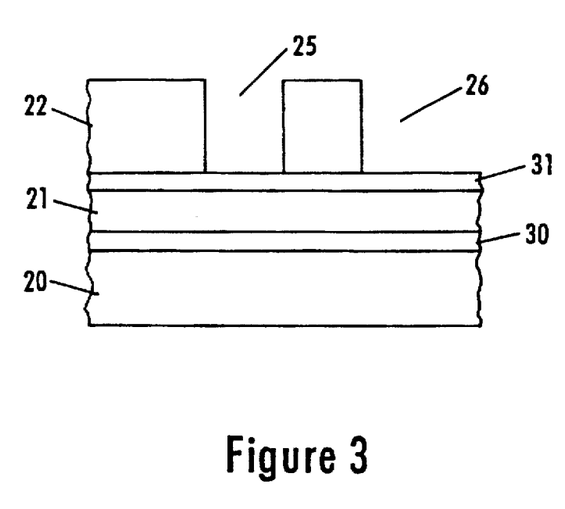
FIG. 3 schematically illustrate another embodiment of the present invention.

The use of a barrier layer and anti-reflective coating is illustrated in FIG. 3, wherein elements similar to those depicted in FIG. 2(a) bear similar reference numerals. In accordance with the embodiment depicted in FIG. 3, barrier metal layer 30 is deposited on oxide layer 20, and anti-reflective coating 31 is deposited on metal layer 21, prior to forming photomask 22 thereon. High density plasma etching is then conducted in the manner disclosed herein introducing nitrogen into the gas flow rate in an amount sufficient to attain a zero or reversed etch rate microloading.

Basically, the method of the present invention is similar to conventional high density plasma etching of a conductive layer to form a dense array of conductive lines in terms of materials, conditions, equipment, and basic manipulative steps. The present invention departs from conventional practices by introducing nitrogen into the etching chemistry in an amount sufficient to increase the high density plasma etch rate within the dense array to no less than that in a bordering open field. Thus, the present invention is generally applicable to the formation of a dense array of conductive lines, preferably comprising a metal, on an insulating layer formed on a semiconductor substrate. The substrates may be any conventional semiconductor substrate, such as monocrystalline silicon. The insulating layer can be formed by any conventional deposition technique, such as chemical vapor deposition or sputtering, and can comprise any insulating material typically employed in the production of semiconductor devices, such as an oxide, preferably silicon dioxide. The conductive layer can be formed by any conventional deposition technique, such as chemical vapor deposition or sputtering, and can comprise any conventional conductive material normally employed in the production of semiconductor devices, such as aluminum or an alloy, preferably an alloy containing titanium, copper and silicon, tungsten, tungsten silicide or polycrystalline silicon.

The present invention is applicable to any conventional high density plasma etching technique for forming a dense array of conductive lines bordered by an open field wherein the etching rate of the conductive material in the open field is greater than the etching rate of the conductive material in the dense array. In the preferred embodiment, high density chlorine plasma etching is conducted utilizing conventional high density chlorine plasma etching equipment, such as Model 9600 commercially available from LAM Research Corp., Fremont, Calif.

The present invention is applicable to various phases in the production of semiconductor devices comprising the formation of dense arrays of conductive lines separated by distances less than about 1.0 micron, preferably less than 0.7 microns, and bordered by an open field having conductive lines separated by distances of at least about 2 microns. The present invention is applicable to any etching technique for forming a dense array of conductive lines bordered by an open field, wherein the etching rate of the conductive material in the open field is greater than the etching rate of the conductive material in the dense array. The present invention is not limited to the particular materials previously mentioned or exemplified, but enjoys utility in the formation of any type of dense array comprising conductive lines.

Only the preferred embodiment of the invention and an example of its versatility is shown and described in the present disclosure. It is to be understood that the invention is capable of use in various other combinations and environments and is capable of changes or modifications within the scope of the inventive concept as expressed herein.

I claim:

1. A method of manufacturing a semiconductor device having a dense array of conductive lines, which method comprises:

forming an insulating layer;

forming a layer of conductive material on the insulating layer;

forming a mask on the layer of conductive material, which mask contains a pattern defining a dense array of conductive lines bordered by an open field; and etching the conductive layer through the mask with a high density plasma generated by a gas flow containing nitrogen in an amount ranging from about 20 to about 50% volume of the total gas flow and sufficient to increase the etch rate of the conductive material within the dense array to no less than the etch rate of the conductive material in the open field, wherein the conductive material is an aluminum alloy containing more than about 0.5% by weight of copper, and further comprising depositing the aluminum alloy at a temperature less than about 150° C. or at a temperature greater than about 350° C.

2. The method according to claim 1, wherein etching is continued until substantially all of the conductive material is removed between conductive lines of the dense array.

3. The method according to claim 1, comprising etching until all conductive material is removed between conductive lines of the dense array and between conductive lines in the open field.

4. The method according to claim 1, further comprising depositing a dielectric layer on the etched conductive layer and planarizing the deposited dielectric layer by etching or chemical-mechanical polishing.

5. The method according to claim 1, comprising introducing nitrogen in an amount ranging from about 25 to about 40% volume of the total gas flow.

6. The method according to claim 1, comprising introducing nitrogen into the gas flow in an amount to increase the etch rate of the conductive material within the dense array above the etch rate of the conductive material within the bordering open field.

7. The method according to claim 1, wherein the insulating layer comprises an oxide.

8. The method according to claim 1, further comprising forming a barrier metal layer on the insulating layer, and forming the layer of conductive material on a metal barrier layer.

9. The method according to claim 8, wherein the barrier layer comprises titanium.

10. The method according to claim 8, further comprising forming an anti-reflective coating on the layer of conductive layer material.

11. The method according to claim 10, wherein the anti-reflective coating comprises titanium nitride.

12. The method according to claim 1, wherein the distance between conductive lines in the dense array is less than about 1.0 μm.

13. The method according to claim 12, wherein the distance between conductive lines in the dense array is less than about 0.7 μm.

14. The method according to claim 1, wherein the distance between conductive lines in the open field is at least about 2.0 μm.

15. The method according to claim 1, wherein the high density plasma comprises at least one component selected from the group consisting chlorine, boron trichloride, carbon tetrafluoride, trifluoromethane, hydrogen bromide and hydrogen chloride.

16. The method according to claim 15, wherein the high density plasma comprises chlorine.

* * * * *

UNITED STATES PATENT AND TRADEMARK OFFICE
CERTIFICATE OF CORRECTION

PATENT NO. : 5,795,829
DATED : August 18, 1998
INVENTOR(S) : Lewis SHEN

It is certified that error appears in the above-indentified patent and that said Letters Patent is hereby corrected as shown below:

In the claims, Column 10, Line 5, please delete "layer"

Signed and Sealed this

Fifth Day of January, 1999

Attest:

Attesting Officer

Acting Commissioner of Patents and Trademarks